United States Patent [19]

Matsumoto et al.

[11] Patent Number: 5,374,320
[45] Date of Patent: Dec. 20, 1994

[54] NB-TI ALLOY TYPE SUPERCONDUCTING WIRE

[75] Inventors: Kaname Matsumoto; Yasuzo Tanaka; Kiyoshi Yamada, all of Yokohama; Osuke Miura, Nikko, all of Japan

[73] Assignee: The Furukawa Electric Co., Ltd., Tokyo, Japan

[21] Appl. No.: 66,563

[22] Filed: May 25, 1993

[30] Foreign Application Priority Data

Jun. 19, 1992 [JP] Japan .................................. 4-160974

[51] Int. Cl.$^5$ .............................................. C22C 14/00
[52] U.S. Cl. ...................................... 148/421; 148/670; 420/901; 505/813
[58] Field of Search ................. 148/421, 670; 420/901; 505/823, 813

[56] References Cited

U.S. PATENT DOCUMENTS

| | | | |
|---|---|---|---|
| 4,564,564 | 1/1986 | Schuller et al. | 428/662 |
| 5,182,176 | 1/1993 | Wong | 420/901 |
| 5,226,947 | 7/1993 | Jablonski et al. | 420/901 |

FOREIGN PATENT DOCUMENTS

| | | | |
|---|---|---|---|
| 47-10820 | 3/1972 | Japan | 505/805 |
| 3-263714 | 11/1991 | Japan . | |

OTHER PUBLICATIONS

Heller et al. Jour. Less–Common Metals 24 (1971) 265.
L. R. Motowidlo et al., *NbTi Superconductors with Artificial Pinning Centers*, Advances in Cryogenic Engineering (Materials), vol. 36, pp. 311–316 (1990).
K. Yamafuji et al., *Achievement of High Current Density in Nb-Ti Superconducting Multifilamentary Wires by Introducing Designed Artificial Pins*, Cryogenics, vol. 31, pp. 431–438 (1991).
C. Meingast et al., Quantative Description of a High $J_c$ Nb-Ti Superconductor During Its Final Optimization Strain: I. *Microstructure, $T_c2$, $H_{c2}$, and Resistivity*, Journal of Applied Physics, vol. 66, pp. 5962–5970 (1989).

*Primary Examiner*—Upendra Roy
*Attorney, Agent, or Firm*—John P. White

[57] ABSTRACT

The present invention provides an Nb-Ti alloy type superconducting wire having a superconducting filament including a member made of Nb-Ti alloy and a pinning member made of Nb or Nb alloy having no superconducting properties under operating magnetic field, the Nb-Ti based alloy containing Ti in a content of 48 to 65% by weight and the superconducting filament containing Nb or an Nb alloy (A) in a ratio of 20 to 35% by volume. The present invention further provides an Nb-Ti alloy type superconducting wire having a superconducting filament including a member made of Nb-Ti alloy and a pinning member made of Ti or Ti alloy having a critical temperature lower than that of the Nb-Ti alloy and/or having no superconducting properties; the Nb-Ti based alloy containing Ti in a content of 25 to 45% by weight and the superconducting filament containing Ti or a Ti alloy in a ratio of 20 to 35% by volume.

16 Claims, 3 Drawing Sheets

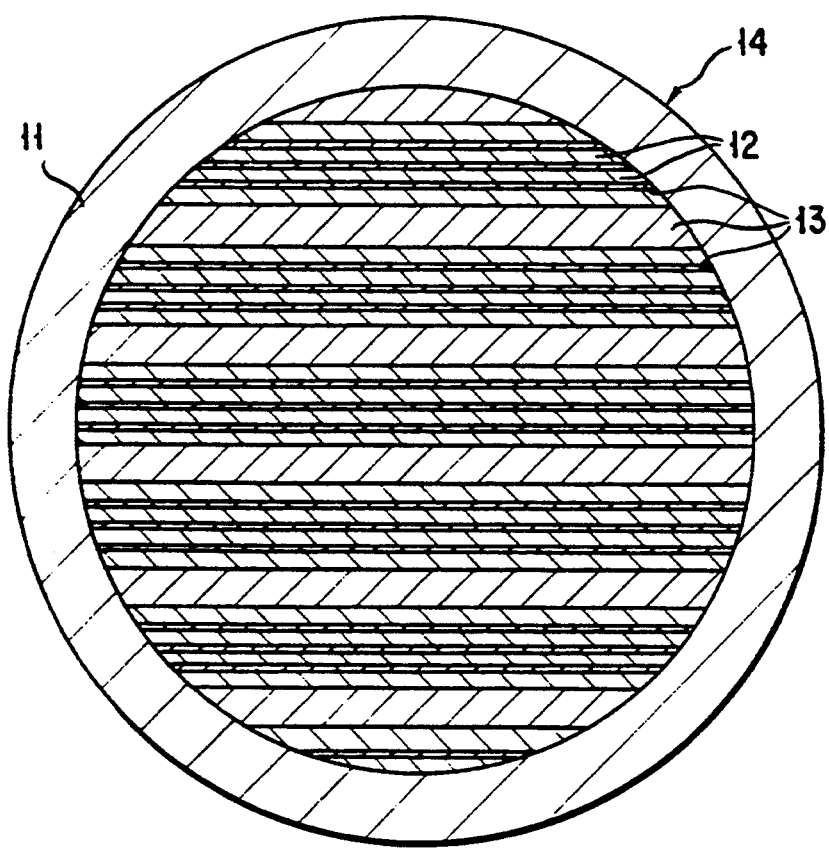
F I G. 3

NB-TI ALLOY TYPE SUPERCONDUCTING WIRE

BACKGROUND OF THE INVENTION

1. Field of the Invention

The present invention relates to an Nb-Ti alloy type superconducting wire and a method of manufacturing the same.

2. Description of the Related Art

An Nb-Ti alloy type superconducting wire has a structure comprising a matrix made of Cu or Cu-based alloy in which at least one Nb-Ti based alloy superconducting filament is incorporated.

A method of manufacturing an Nb-Ti alloy type superconducting wire is known which comprises: inserting a member made of an Nb-Ti alloy ingot in a pipe made of Cu or Cu-based alloy; subjecting the pipe to an area-reduction process including extrusion and drawing, thereby to form a composite billet; making a bundle composed of several the composite billets and inserting the bundle in a Cu or a Cu-based alloy pipe; and subjecting the pipe to an area-reduction process including extrusion and drawing, thereby obtaining a final composite. Hereinafter, this method will be referred to simply as "an inserting method".

Recently developed is a method which comprises: embedding a metal such as Nb and Ti which exhibits no superconducting properties in a certain condition—i.e., a temperature of 4.2K, under a magnetic field of several tesla—in advance in a starting Nb-Ti alloy and producing a composite wire in substantially the same manner as described the above. Hereinafter, this method will be referred to simply as "an artificial pinning method".

In the inserting method, a metal phase precipitated from an Nb-Ti alloy matrix called an $\alpha$-Ti phase is used as a pinning center to control a principal property of a superconducting wire, that is, a critical current density (hereinafter referred to as "Jc"). On the other hand, in the embedding method, an embedded non-superconducting material is used as a pinning center.

In the inserting method, an appropriate heat treatment accompanied by a cold working is required to allow the $\alpha$-Ti phase in the Nb-Ti alloy matrix to be an efficient pinning center. However, since it is difficult accurately to know an amount and a form of $\alpha$-Ti phase in a method of manufacturing a superconducting wire, it is very hard to accurately design a superconducting wire having an appropriate Jc value. In addition, this method requires a plurality of complicated and time-consuming processes inevitably raising the manufacturing cost.

On the other hand, in the artificial pinning method, an amount and a change in the form of introduced pinning centers can be estimated. Therefore, it is possible accurately to design a superconducting material having an appropriate Jc value. However, the artificial pinning method has a drawback that a Jc value certainly increases in a low magnetic field of 1 to 3 T, but decreases significantly in a high and middle magnetic field of 4 T or more compared to the inserting method (reported by L. R. Motowidlo et al., Adv. Cryog. Eng., Vol. 36, page 311, 1990; K. Yamafuji et al., Cryogenics, vol. 31 page 431, 1991). A method of preventing the significant decrease of a Jc value in a middle and high magnetic field has not yet been established. This is a main reason why the embedding method has not been widely used in practice compared to the inserting method.

SUMMARY OF THE INVENTION

It is an object of the present invention to provide an Nb-Ti alloy type superconducting wire, a Jc value of which in a middle and high magnetic field is increased.

It is another object of the present invention to provide a method to efficiently manufacture an Nb-Ti alloy type superconducting wire.

The present invention provides an Nb-Ti alloy type superconducting wire having a superconducting filament comprising a member made of Nb-Ti alloy and a pinning member made of Nb or Nb alloy {hereinafter referred to as "Nb alloy (A)"} having no superconducting properties under operating magnetic field; the Nb-Ti based alloy containing Ti in a content of 48 to 65% by weight and the superconducting filament containing Nb or an Nb alloy (A) in a ratio of 20 to 35% by volume.

The present invention further provides an Nb-Ti alloy type superconducting wire having a superconducting filament comprising a member made of Nb-Ti alloy and a pinning member made of Ti or Ti alloy {hereinafter referred to as "Ti alloy (B)"} having a critical temperature lower than that of an Nb-Ti based alloy in the Nb-Ti alloy member and/or having no superconducting properties; the Nb-Ti based alloy containing Ti in a content of 25 to 45% by weight and the superconducting filament containing Ti or a Ti alloy in a ratio of 20 to 35% by volume.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a diagram showing another representative process of manufacturing the Nb-Ti alloy type superconducting wire of the present invention.

DETAILED DESCRIPTION OF THE PREFERRED EMBODIMENT

Figure 1:
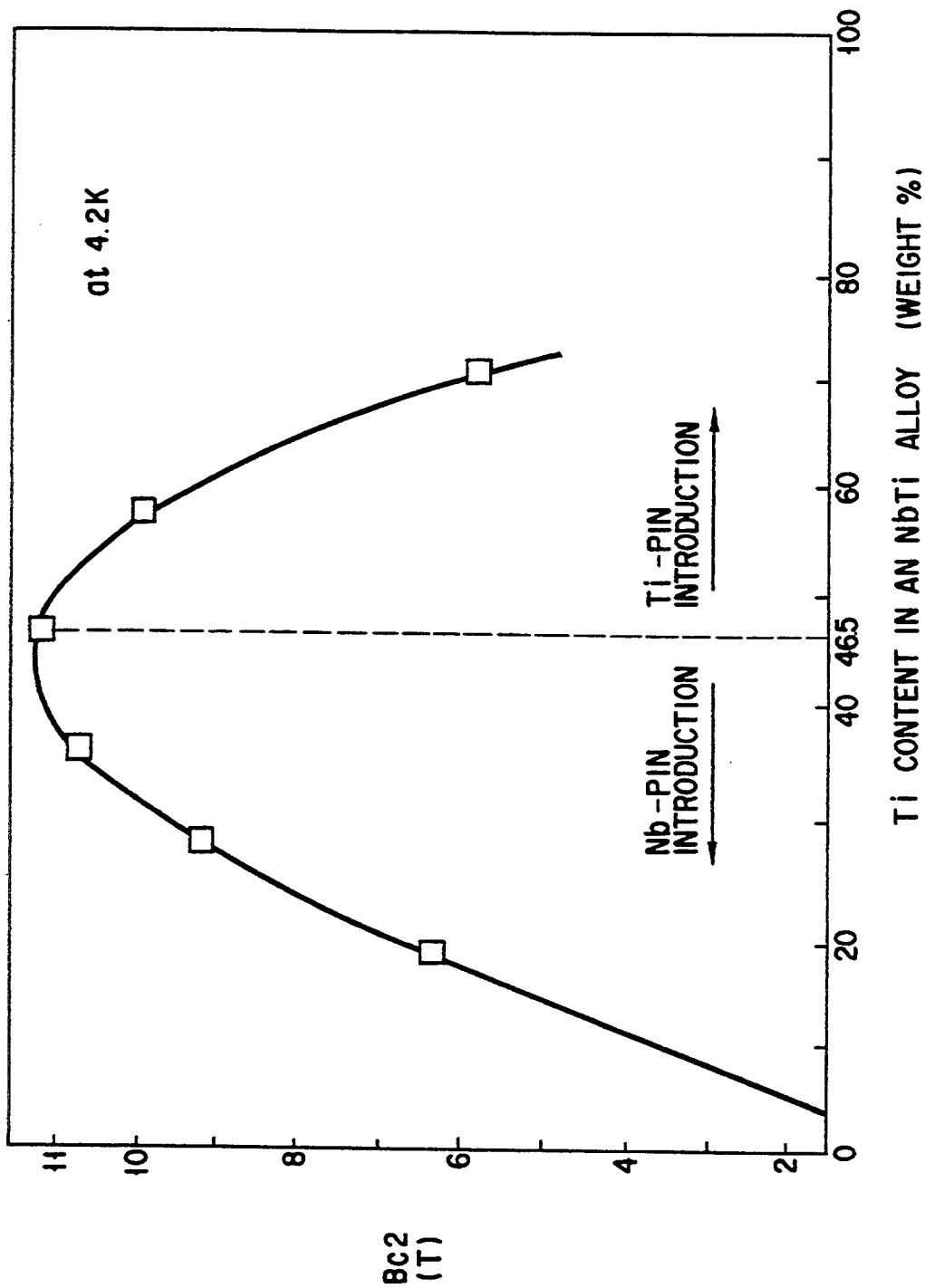
FIG. 1 is a graph showing a change in the Bc2 value relative to the Ti content of an Nb-Ti based alloy.

In one aspect of the present invention, a Ti content of an Nb-Ti based alloy is 48 to 65% by weight and a volume ratio of Nb or an Nb alloy (A) in an superconducting wire is 20 to 35% in the Nb-Ti alloy type superconducting wire.

In still a further aspect of the present invention, a Ti content of an Nb-Ti based alloy is 25 to 45% by weight and a volume fraction of Ti or a Ti alloy (B) in a superconducting filament is 20 to 35% in an Nb-Ti alloy type superconducting wire.

An example of an Nb-Ti based alloy is one having an additional element such as Ta, Hf. The additional element may contribute to increasing an upper critical field (hereinafter referred to as "Bc2").

An example of an Nb alloy (A) is one having an additional element such as Ti, Ta, Al, Mg, Fe, Hf, Cu, Ge, Ni, Zr, and Cr. An example of a Ti-based alloy (B) is one having an additional element such as Nb, Ta, Al, Mg, Fe, Hf, Cu, Ge, Ni, Zr, and Cr.

The above mentioned Nb-Ti alloy type superconducting wire can be produced by means of any one of the following methods.

The first method comprises: combining a member made of an Nb-Ti alloy having 48 to 65% by weight of Ti with a member made of Nb or an Nb alloy (A); subjecting the combined members to drawing process, to thereby form a composite billet. The volume fraction of the Nb or Nb alloy (A) in the composite billet is adjusted to 20 to 35%. Then, a composite wire is formed by bundling a plurality of composite billets; and subjecting the composite wire to a process including extrusion and drawing, if necessary, thereby to form an Nb-Ti alloy type superconducting wire. The obtained superconducting wire of the first method contains a superconducting filament having a structure comprising an Nb-Ti based alloy matrix and Nb or Nb alloy (A) pinning centers, with the Nb-Ti based alloy containing Ti in a content of 48 to 65% by weight, and the superconducting filament containing Nb or an Nb-based alloy (A) in a ratio of 20 to 35% by volume.

A second method comprises: combining a member made of an Nb-Ti alloy having 25 to 45% by weight of Ti a member made of with Ti or a Ti alloy (B); subjecting the combined members to drawing process, to thereby form a composite billet. The volume fraction of the Ti or Ti alloy (B) in the composite billet is adjusted to 20 to 35%. Then, a composite wire is formed by bundling a plurality of composite billets; and subjecting the composite wire to a process including extrusion and drawing, if necessary, thereby to form an Nb-Ti alloy type superconducting wire. The obtained superconducting wire contains a superconducting filament having a structure comprising an Nb-Ti based alloy matrix and Ti or a Ti alloy (B) pinning centers with the Nb-Ti based alloy containing Ti in a content of 25 to 45% by weight and the superconducting filament containing Ti or a Ti alloy (B) in a ratio of 20 to 35% by volume.

A third method comprises: stacking a member made of an Nb-Ti based alloy and a member made of Nb or an Nb alloy (A), or a member made of an Nb-Ti based alloy and a member made of Ti or a Ti alloy (B) alternately one on top of the other; subjecting the stacked members to an area-reduction process, thereby to form a composite billet; forming a composite wire by bundling a plurality of the above composite billets; if necessary, further subjecting the composite wire to a composite-processing and an area-reduction process, thereby obtaining an Nb-Ti alloy type superconducting wire. When Nb or an Nb alloy (A) is used as a pinning center in this method, the Nb-Ti based alloy preferably has a Ti content of 48 to 65% by weight. On the other hand, when Ti or Ti alloy (B) is used as a pinning center, the Nb-Ti based alloy preferably has a Ti content of 25 to 45% by weight.

As a stacked type of an Nb-Ti based alloy member and Nb or an Nb alloy (A) member, or an Nb-Ti based alloy member and Ti or a Ti alloy (B) member, there may be mentioned the following three examples:

(1) stacking two types of metal plates alternately one on top of the other in a continuous manner. One of the two types of plates is made of Nb-Ti based alloy and the other is made of Nb or Nb alloy (A), or Ti or Ti alloy (B);

(2) assembling two types of metal pipes of different diameter alternately one to the other in a continuous manner. One of the two types of pipes is made of Nb-Ti based alloy and the other is made of Nb or Nb alloy (A), or Ti or Ti alloy (B); and (3) stacking two types of metal foils alternately one on top of the other. One of the two type of foils is made of Nb-Ti based alloy and the other is made of Nb or Nb alloy (A), or Ti or Ti alloy (B).

The proportion in thickness of an Nb-Ti based alloy member to Nb or an Nb alloy (A) member, or an Nb-Ti based alloy member to Ti or a Ti alloy (B) member is preferably in a range of 1 to 20.

According to the third method, it is easy to introduce Nb or Nb alloy, or Ti or Ti alloy (B) as a pinning center in an Nb-Ti based alloy. Accordingly, the third method enables to easily produce an Nb-Ti alloy type superconducting wire having excellent superconducting properties, especially an excellent critical current density, without a complicated heat treatment performed in conventional methods In the third method, a pinning force is proportional to a change in volume of quantized flux lines overlapped with pins, in other words, a change in a pinning potential accompanying a shift of quantized flux lines in a superconducting filament. Therefore, to increase the pinning force when a volume fraction of pins per superconducting filament does not change, it is necessary to increase the volume change of the overlapped portion accompanying the shift of quantized flux lines. From this point of view, it is preferable to use the first type, in which two types of metal plates are stacked alternately one on top of the other and form a composite wire through a reduced-area process. In this method, a stacking direction of metal plates made of an Nb-Ti based alloy is different with metal plates forming pinning centers in various directions, with the result that a change in volume of quantized flux lines overlapped with pins accompanying the shift of quantized flux lines is increased, thereby to obtain a high pinning force.

A fourth method comprises: preparing two types of metal members of different cross-sectional area made of Nb or Nb alloy, or Ti or Ti alloy; physically combining the two types of metal members with an Nb-Ti based alloy member, subjecting the combined members to an area-reduction process, to thereby form a composite billet; forming the composite wire by bundling a plurality of composite billets; and if necessary, subjecting the composite wire to a composite-processing and an area-reduction process, thereby to form a desired Nb-Ti alloy type superconducting wire. When Nb or an Nb alloy (A) is used as a pinning center in this method, the Nb-Ti based alloy preferably has a Ti content of 48 to 65% by weight. On the other hand, when Ti or Ti alloy (B) is used as a pinning center, the Nb-Ti based alloy preferable has a Ti content of 25 to 45% by weight.

When forming at least two metals of different cross-sectional area, can be employed a method in which two metal plates having different thickness each other are stacked one on top of the other.

The obtained Nb-Ti alloy type superconducting wire through the fourth method has pinning centers having various cross-sectional areas in a superconducting filament. A pinning center having a relatively large cross-sectional area is effective in a low magnetic filed. On the contrary, a pinning center having a relatively small cross-sectional area is effective in a high magnetic filed. Due to these properties, it is possible to increase a Jc value of an Nb-Ti alloy type superconducting wire in a middle and high magnetic field.

Hereinafter, the effect of the Nb-Ti alloy type superconducting wire of the present invention will be described in detail.

An Nb-Ti alloy is a complete solid solution and a superconducting property thereof is affected by a Ti content thereof. For example, a critical temperature (Tc) constantly decreases in inverse proportion to a Ti content. When a Ti content is less than 40% by weight as shown in FIG. 1, an upper critical field (Bc2) increases in proportion as a Ti content and when the Ti content reaches in a range of 40 to 50% by weight, a Bc2 value shows 11 T or more. However, when a Ti content exceeds 50% by weight, a Bc2 value starts to decrease (see C. Meingast et al., J. Appl. Phys., Vol. 66, page 5962, 1989). From this point of view, the superconducting filament in a cited literature in "Description of the Related Art" in this specification is made of an Nb-Ti alloy containing Ti in a content of 46.5% by weight having a high Bc2 value and an Nb metal as a pinning center. The Nb-Ti alloy containing 46.5% by weight of Ti is a widely used for an α-Ti phase precipitation. This Nb-Ti alloy is provided in a large amount and excellent in a processing property and uniformity.

However, since Nb is purposely introduced in the Nb-Ti alloy containing 46.5% by weight of Ti as in the cited literature, the Nb-Ti alloy is no longer suitable for forming a superconducting wire. That is, as introducing Nb to the Nb-Ti alloy as a pinning center, the composition in a superconducting filament is shifted to Nb-rich side with the result that a Bc2 value decreases. When Ti is introduced in the Nb-Ti alloy as a pinning center, the composition of a superconducting filament is shifted to Ti-rich side with the result that a Bc2 value decreases.

In order to improve a Jc property, it is generally believed not only in an embedding process but also in an inserting method to adjust a size of a pinning center made of the purposely introduced Nb small enough to give a pinning effect by means of a cold working including drawing. However, in this procedure, although a Jc value increases when the size of a pinning center decreases to a coherence length of an Nb-Ti alloy matrix, (for example, 5.7 nm, which is a value of a coherence length of an Nb-Ti based alloy having Bc2=10 T), a penetration of superconducting electrons from an Nb-Ti alloy to pinning centers called "proximity effect" occurs frequently with the result that a Tc and a Bc2 value decrease. The present inventors have conducted intensive and extensive studies and found that the decrease of a Bc2 value caused by "proximity effect" has a strong correlation with the deterioration of a Jc property in a middle and high magnetic field.

Therefore, it is considered that improvement of a Jc property in a middle and high magnetic field can be achieved by suppressing the decrease in a Bc2 value by adjusting a ratio of an introduced pinning metal relative to an Nb-Ti alloy matrix in a superconducting filament so as to approach the Bc2 value to maximum value.

The present invention has been made based on the above-findings. The present inventors overcome the decrease of a Bc2 value accompanying the introduction of pinning centers and improved a Jc property in a middle and high magnetic field by determining a Ti content of an Nb-Ti based alloy as 48 to 65% by weight and the volume ratio of Nb or an Nb alloy in a superconducting filament as 20 to 35% when Nb or an Nb alloy (A) is introduced as a pinning center in an Nb-Ti based alloy matrix of a superconducting filament.

Moreover, the decrease of a Bc2 value accompanying introduction of a pinning center can be inhibited and a Jc property in a middle and high magnetic field can be improved by determining the Ti content of an Nb-Ti based alloy as 25 to 45% by weight and the volume ratio of Ti or a Ti alloy (B) in a superconducting filament as 20 to 35% when Ti or a Ti alloy (B) is introduced as a pinning center in an Nb-Ti based alloy matrix of a superconducting filament.

Hereinafter, Examples of the present invention will be described in detail with reference to the following drawings.

EXAMPLE 1

Figure 2A:
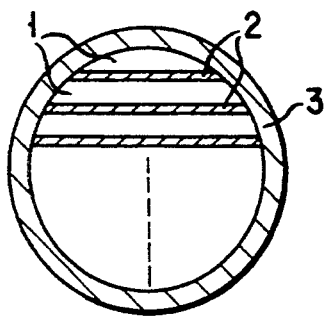
FIGS. 2A to 2G are diagrams showing a representative process of manufacturing the Nb-Ti alloy type superconducting wire of the present invention.
Figure 2B:
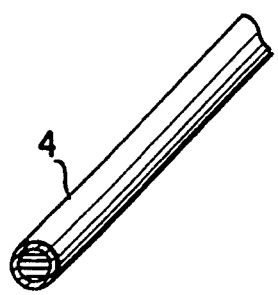
Figure 2C:
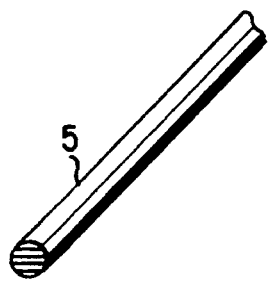
Figure 2D:
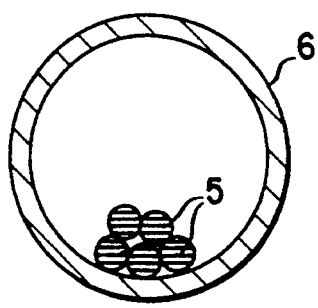

As shown in FIG. 2A, an Nb alloy plate 1 containing 52% by weight of Ti and an Nb plate 2 were stacked alternately one on top of the other in a continuous manner to thereby form a stacked body. The stacked body was inserted in a Cu pipe 3 having an outer diameter of 45 mmφ and an inner diameter of 35 mmφ, thereby obtaining a composite billet. The volume ratio of the Nb plates 2 relative to a stacked body comprising Nb-Ti alloy plates 1 and Nb plates 2 is adjusted to 20%. Thereafter, the composite billet is subjected to a process including hot extruding and drawing, to thereby form a composite wire 4 having a diameter of 1.3 mm shown in FIG. 2B. An outerface Cu of the composite wire 4 was dissolved and removed by nitric acid, thereby obtaining the first composite wire 5 shown in FIG. 2C.

Figure 2E:
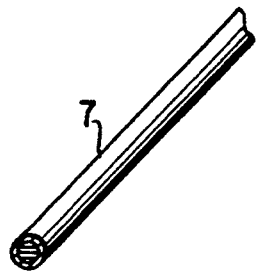
Figure 2F:
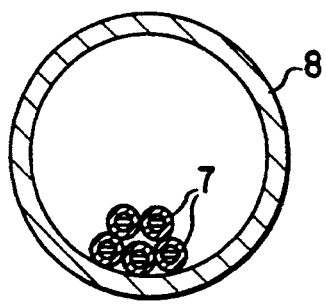

800 of thus obtained first composite wires 5 were inserted in a Cu pipe 6 having an outer diameter of 45 mmφ and an inner diameter of 35 mmφ, further subjected to a process including hot extruding and drawing, thereby obtaining a secondary composite wire 7 having a diameter of 1 mm as shown in FIG. 2E.

Figure 2G:
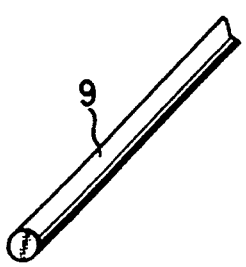

Moreover, 800 of thus obtained secondary composite wires 7 were inserted in a Cu pipe 8 having an outer diameter of 45 mmφ and an inner diameter of 35 mmφ, and subjected to a process including hot extruding and drawing, thereby obtaining a final composite. Then, is obtained a desired Nb-Ti alloy type superconducting wire 9 having a structure comprising 800 of superconducting filaments incorporated in a Cu matrix as shown in FIG. 2G.

EXAMPLES 2 TO 5 AND COMPARATIVE EXAMPLES 1 TO 4

A Nb-Ti alloy type superconducting wire was formed in substantially the same manner as in Example 1 except that a composition of an Nb-Ti alloy plate and a volume ratio of an Nb plate relative to a stacked body comprising Nb-Ti alloy plates and Nb plates were adjusted as shown in Table 1. Critical current densities (Jc) of Nb-Ti alloy type superconducting wires in Examples 1 to 5 and Comparative Examples 1 to 4 were measured at a temperature of 4.2K, in liquid helium, under magnetic fields of 5 T and 8 T. The results are also shown in Table 1.

TABLE 1

| Composition of a NbTi alloy; *1 | a percentage of a Nb plate in a layered body *2 | Critical current density; Jc (A/mm²) 5T | 8T |
| --- | --- | --- | --- |
| Example 1 | Nb-52 wt % Ti | 20% by volume | 3450 | 1150 |
| Example 2 | " | 30% by volume | 3530 | 1250 |
| Example 3 | " | 35% by volume | 3380 | 1000 |
| Example 4 | Nb-65 wt % Ti | 25% by volume | 3400 | 1500 |
| Example 5 | " | 30% by volume | 3440 | 900 |
| Comparative Example 1 | Nb-70 wt % Ti | 25% by volume | 2450 | 400 |
| Comparative Example 2 | Nb-65 wt % Ti | 15% by volume | 2500 | 700 |
| Comparative Example 3 | " | 40% by volume | 2200 | 500 |
| Comparative Example 4 | Nb-46.5 wt % Ti | 25% by volume | 2890 | 400 |

*1... This Nb/Ti content is the same as that in a superconducting filament in a NbTi alloy type superconducting wire.
*2... This Nb content is the same as that in a superconducting filament in a NbTi alloy type superconducting wire.

As is apparent from Table 1, an Nb-Ti alloy type superconducting wires of Examples 1 to 5 have high Jc values under magnetic fields of 5 T and 8 T compared to those of Comparative Examples 1 to 4. The high values are attributed to a structure of each superconducting filament comprising an Nb-Ti alloy matrix and Nb pinning centers, and a Ti content in a range of 48 to 65% by weight in the Nb-Ti alloy matrix and Ti volume ratio in a range of 20 to 35% by volume in the superconducting filament.

When an Nb-Ti based alloy containing an element, such as Ti, Ta, Al, Mg, Fe, Hf, Cu, Ge, Ni, Zr, Cr, except Nb was used in a content of 20% or less by weight as a pinning center, the same results as in the above were obtained.

EXAMPLE 6

Nb-Ti alloy plates containing 38% by weight of Ti and Ti metal plates were stacked alternately one on top of the other in a continuous manner to thereby form a stacked body. Thus obtained stacked body was ground in order to be inserted in a Cu pipe having an outer diameter of 45 mmφ and an inner diameter of 35 mmφ, and inserted in the Cu pipe, thereby obtaining a composite billet. The volume ratio of Ti plates relative to a stacked body comprising Nb-Ti alloy plates and Ti plates was adjusted to 20%. Then the composite billet was subjected to a process including hot extruding and drawing, to thereby form a composite wire having a diameter of 1.3 mm. An outerface Cu of the composite wire was dissolved and removed by nitric acid, thereby obtaining the first composite.

Thereafter, the obtained first composite wire was subjected twice to a reducing-area process including hot extruding and drawing, thereby obtaining a desired an Nb-Ti alloy type superconducting wire having the same cross-sectional structure as that in Example 1.

EXAMPLES 7 TO 10 AND COMPARATIVE EXAMPLES 5 TO 8

An Nb-Ti alloy type superconducting wire was formed in substantially the same manner as in Example 6 except that a composition of an Nb-Ti alloy plate and a volume ratio of Ti plates relative to a stacked body comprising Nb-Ti alloy plates and Ti plates were adjusted to as shown in Table 2.

Critical current densities (Jc) of Nb-Ti alloy type superconducting wires in Examples 6 to 10 and Comparative Examples 5 to 8 were measured at a temperature of 4.2K, in liquid helium, under magnetic fields of 5 T and 8 T. The results are also shown in Table 2.

TABLE 2

| Composition of a NbTi alloy; *1 | a percentage of a Ti plate in a layered body *3 | Critical current density; Jc (A/mm²) 5T | 8T |
| --- | --- | --- | --- |
| Example 6 | Nb-38 wt % Ti | 20% by volume | 3350 | 1250 |
| Example 7 | " | 30% by volume | 3510 | 1250 |
| Example 8 | " | 35% by volume | 3460 | 1000 |
| Example 9 | Nb-25 wt % Ti | 25% by volume | 3410 | 950 |
| Example 10 | " | 30% by volume | 3440 | 1000 |
| Comparative Example 5 | Nb-20 wt % Ti | 25% by volume | 2300 | 500 |
| Comparative Example 6 | Nb-25 wt % Ti | 15% by volume | 2700 | 650 |
| Comparative Example 7 | " | 40% by volume | 2600 | 400 |
| Comparative Example 8 | Nb-46.5 wt % Ti | 25% by volume | 2890 | 400 |

*1... This Nb/Ti content is the same as that in a superconducting filament in a NbTi alloy type superconducting wire.
*3... This Ti content is the same as that in a superconducting filament in a NbTi alloy type superconducting wire.

As is apparent from Table 2, an Nb-Ti alloy type superconducting wires of Examples 6 to 10 have higher Jc values under magnetic fields of 5 T and 8 T compared to those of Comparative Examples 5 to 8. The high values are attributed to a structure of each superconducting filament comprising an Nb-Ti alloy matrix and Ti pinning centers, and a Ti content in a range of 25 to 45% by weight in the Nb-Ti alloy matrix and a Ti volume ratio in a range of 20 to 35% by volume in the superconducting filament.

When a Ti-based alloy containing an element, such as Nb, Ta, Al, Mg, Fe, Hf, Cu, Ge, Ni, Zr, Cr, except Ti was used in a content of 20% or less by weight, the same results as in the above were obtained.

EXAMPLE 11

An Nb-Ti based alloy plate 12 containing 60% by weight of Ti and an Nb plate 13 were stacked alternately one on top of the other in a continuous manner to thereby form a stacked body. Thus obtained stacked body was ground in order to be inserted in a Cu pipe 11 having an outer diameter of 200 mmφ and an inner diameter of 170 mmφ and inserted in the Cu pipe, thereby obtaining the first composite billet 14. Two types of Nb plates 13 were prepared. One was an Nb plate 13 having a thickness of 10 mm. The other was an Nb plate 13 having a thickness of 1 mm. One unit composed of 4 of the former Nb plates and the other unit composed of 15 of the latter Nb plates were used to form the stacked body. Then, the obtained first composite billet was subjected to a process including hot extruding and drawing to thereby form the composite wire having an outer diameter of 1.2 mm. An outerface Cu of the composite wire was dissolved and removed by nitric acid and 1000 of the obtained composite wires were filled in a Cu pipe having an outer diameter of 45 mmφ and an inner diameter of 38 mmφ, thereby obtaining a secondary composite billet.

Thereafter, the obtained secondary composite billet was subjected to an area-reduction process including hot extruding and drawing to obtain a single core composite wire having outer diameter of 1.0 mmφ. Thus obtained composite core wire was further inserted in a Cu pipe having an outer diameter of 45 mmφ and an inner diameter of 38 mmφ, thereby obtaining a tertially composite billet. The tertially composite billet was subjected to a reducing-area process including hot extruding and drawing, thereby obtaining a desired Nb-Ti alloy type superconducting wire of Example 11 having an outer diameter 0.2 mmφ.

EXAMPLE 12

An Nb-Ti alloy type superconducting wire of Example 12 was formed in substantially the same manner as in Example 11 except that one unit composed of 4 of Nb plates having a thickness of 10 mm and the other unit composed of 5 of Nb plates having a thickness of 1 mm were used to form a stacked body.

EXAMPLE 13

An Nb-Ti alloy type superconducting wire of Example 13 was formed in substantially the same manner as in Example 11 except that a stacked body was formed by one unit composed of 4 of Nb plates having a thickness of 10 mm and the other unit composed of an Nb-Ti based alloy plate having a thickness thereof plus 1 mm instead of 15 of Nb plates having a thickness of 1 mm.

Critical current densities (Jc) of Nb-Ti alloy type superconducting wires in Examples 11 to 13 were measured at a temperature of 4.2K, in liquid helium, under magnetic fields of 5 T and 8 T. The results are also shown in Table 3.

TABLE 3

| Valve of a magnetic field | Critical current density (A/mm²) | |
| --- | --- | --- |
| | 5T | 8T |
| Example 16 | 3620 | 1230 |
| Example 17 | 3490 | 1140 |
| Example 18 | 3130 | 1050 |

In Examples 11 and 12, an Nb plate having a thickness of 10 mm before processing functioned as a big pinning center in a final superconducting wire to increase a Jc value in a low magnetic field and an Nb plate having a thickness of 1 mm before processing functioned as a small pinning center to increase a Jc value in a middle and high magnetic field. Accordingly, the superconducting wire obtained in Examples 11 and 12 had higher Jc values compared to that of the superconducting wire obtained in Example 13 using Nb plates having the same thickness.

EXAMPLE 14

An Nb-Ti based alloy plate containing 28% by weight of Ti and a Ti plate were stacked alternately one on the top of the other in a continuous manner to thereby form a stacked body. Thus obtained stacked body was ground in order to be inserted in a Cu pipe having an outer diameter of 200 mmφ and an inner diameter of 170 mmφ, thereby obtaining the first composite billet. Two types of Ti plates were prepared. One was a Ti plate having a thickness of 10 mm. The other was a Ti plate having a thickness of 1 mm. One unit composed of 4 of the former type Ti plates and the other unit composed of 15 of the latter type Ti plates were used to form the stacked body.

Then the first composite billet was subjected to a reducing-area process including hot extruding and drawing to thereby form the composite wire having an outer diameter of 1.2 mm. An outerface Cu of the composite wire was dissolved and removed by nitric acid and then 1000 of the obtained composite wires were inserted in a Cu pipe having an outer diameter of 45 mmφ and an inner diameter of 38 mmφ, thereby obtaining a secondary composite billet.

Thereafter, the obtained secondary composite billet was subjected to an area-reduction process including hot extruding and drawing to obtain a single-core composite wire having an outer diameter of 1.0 mmφ. Thus obtained single-core composite wire was further inserted in a Cu pipe having an outer diameter of 45 mmφ and an inner diameter of 38 mmφ, thereby obtaining a tertially composite billet. The tertially composite billet was subjected to an area-reduction process including hot extruding and drawing, thereby obtaining a desired Nb-Ti alloy type superconducting wire of Example 14 having an outer diameter 0.2 mmφ.

EXAMPLE 15

An Nb-Ti alloy type superconducting wire of Example 15 was formed in substantially same manner as in Example 14 except that 4 of Ti plates having a thickness of 10 mm and 5 of Ti plates having a thickness of 1 mm were stacked one to top of the other in a continuous manner.

EXAMPLE 16

An Nb-Ti alloy type superconducting wire of Example 16 was formed in substantially the same manner as in Example 14 except that a stacked body was formed by one unit composed of 4 of Ti plates having a thickness of 10 mm and the other unit composed of an Nb-Ti based alloy plate having a thickness thereof plus 1 mm instead of 15 of Ti plates having a thickness of 1 mm.

Critical current densities (Jc) of Nb-Ti alloy type superconducting wires in Examples 14 to 16 and were measured at a temperature of 4.2K, in liquid helium, under magnetic fields of 5 T and 8 T. The results are also shown in Table 4.

TABLE 4

| Valve of a magnetic field | Critical current density (A/mm²) | |
| --- | --- | --- |
| | 5T | 8T |
| Example 19 | 3480 | 1180 |
| Example 20 | 3360 | 1090 |
| Example 21 | 3060 | 1000 |

In Examples 14 and 15, a Ti plate having a thickness of 10 mm before processing functioned as a big pinning center in a final superconducting wire to increase a Jc value in a low magnetic field and a Ti plate having a thickness of 1 mm before processing functioned as a small pinning center to increase a Jc value in a middle and high magnetic field. Accordingly, the superconducting wire obtained in Examples 14 and 15 had higher Jc values compared to that of the superconducting wire obtained in Example 16 using Ti plates having the same thickness.

From the foregoing, according to the present invention, there can be obtained an Nb-Ti alloy type superconducting wire having a high Jc value even in a middle and high magnetic field and preferably available for a magnet etc. in use for MRI.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An Nb-Ti alloy superconducting wire having a high current density comprising a superconducting filament including at least one member made of Nb-Ti based alloy and at least one pinning member stacked alternately with respect to the member made of Nb-Ti based alloy, said pinning member being made of a metal selected from the group consisting of Nb, and an Nb alloy having no superconducting properties under operating magnetic field,
   wherein said Nb-Ti based alloy contains Ti in a content of 48 to 65% by weight and said superconducting filament contains said Nb or Nb alloy in a ratio of 20 to 35% by volume.

2. The Nb-Ti alloy superconducting wire according to claim 1, wherein said Nb-Ti based alloy is an alloy selected from the group consisting of an Nb-Ti alloy, an Nb-Ti-Ta alloy, and an Nb-Ti-Hf alloy.

3. The Nb-Ti alloy superconducting wire according to claim 1, wherein said Nb alloy is an alloy having an additional element selected from the group consisting of Ti, Ta, Al, Mg, Fe, Hf, Cu, Ge, Ni, Zr, and Cr.

4. The Nb-Ti alloy superconducting wire according to claim 1, wherein said at least one member and said at least one pinning member have a plate-shape.

5. The Nb-Ti alloy superconducting wire according to claim 1, wherein said at least one member and said at least one pinning member have a foil-shape.

6. The Nb-Ti alloy superconducting wire according to claim 1, wherein said at least one member and said at least one pinning member are pipes having a different diameter from each other.

7. The Nb-Ti alloy superconducting wire according to claim 1, wherein a proportion in thickness of one of said at least one member to one of said at least one pinning member is in a range of 1 to 20.

8. The Nb-Ti alloy superconducting wire according to claim 1, wherein there are at least two pinning members having two different cross-sectional areas.

9. An Nb-Ti alloy superconducting wire comprising a superconducting filament having a high current density including at least one member made of Nb-Ti based alloy and at least one pinning member stacked alternately with respect to the member made of Nb-Ti based alloy, said pinning member being made of a metal selected from the group consisting of Ti, a Ti alloy having a critical temperature lower than that of said Nb-Ti based alloy, and a Ti alloy having no superconducting properties,
   wherein said Nb-Ti based alloy contains Ti in a content of 25 to 45% by weight and said superconducting filament contains said Ti or Ti alloy in a range of 20 to 35% by volume.

10. The Nb-Ti alloy superconducting wire according to claim 9, wherein said Nb-Ti based alloy is an alloy selected from the group consisting of an Nb-Ti alloy, an Nb-Ti-Ta alloy, and an Nb-Ti-Hf alloy.

11. The Nb-Ti alloy superconducting wire according to claim 9, wherein said Ti alloy is an alloy having an additional element selected from the group consisting of Nb, Ta, Al, Mg, Fe, Hf, Cu, Ge, Ni, Zr, and Cr.

12. The Nb-Ti alloy superconducting wire according to claim 9, wherein said at least one member and said at least one pinning member have a plate-shape.

13. The Nb-Ti alloy superconducting wire according to claim 9, wherein said at least one member and said at least one pinning member have a foil-shape.

14. The Nb-Ti alloy superconducting wire according to claim 9, wherein said at least one member and said at least one pinning member are pipes having a different diameter from each other.

15. The Nb-Ti alloy superconducting wire according to claim 9, wherein a proportion in thickness of one of said at least one member to one of said at least one pinning member is in a range of 1 to 20.

16. The Nb-Ti alloy superconducting wire according to claim 9, wherein there are at least two pinning members having two different cross-sectional areas.

* * * * *